US012289552B2

(12) United States Patent
Yokoyama et al.

(10) Patent No.: US 12,289,552 B2
(45) Date of Patent: Apr. 29, 2025

(54) IMAGING DEVICE AND DRIVING METHOD

(71) Applicant: Panasonic Intellectual Property Management Co., Ltd., Osaka (JP)

(72) Inventors: Takamichi Yokoyama, Kanagawa (JP); Hiroaki Iijima, Nara (JP); Morio Mitsuishi, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 203 days.

(21) Appl. No.: 18/315,514

(22) Filed: May 11, 2023

(65) Prior Publication Data
US 2023/0283927 A1 Sep. 7, 2023

Related U.S. Application Data

(63) Continuation of application No. PCT/JP2021/043138, filed on Nov. 25, 2021.

(30) Foreign Application Priority Data

Dec. 11, 2020 (JP) ................ 2020-205876

(51) Int. Cl.
*H04N 25/77* (2023.01)
*H04N 25/63* (2023.01)
(Continued)

(52) U.S. Cl.
CPC ............ *H04N 25/77* (2023.01); *H04N 25/63* (2023.01); *H04N 25/709* (2023.01); *H10K 39/32* (2023.02)

(58) Field of Classification Search
CPC ...... H04N 27/77; H04N 25/63; H04N 25/709; H04N 25/76; H10K 39/12; H10F 39/12; Y02E 10/549
See application file for complete search history.

(56) References Cited

U.S. PATENT DOCUMENTS 8,786,742 B2* 7/2014 Mabuchi ................ 348/294
12,058,877 B2* 8/2024 Hirade ............ H10K 85/211
(Continued)

FOREIGN PATENT DOCUMENTS

| JP | 2014-022525 | 2/2014 |
| JP | 2018-092990 | 6/2018 |
| WO | 2017/163923 | 9/2017 |

OTHER PUBLICATIONS

International Search Report of PCT application No. PCT/JP2021/043138 dated Jan. 25, 2022.

*Primary Examiner* — Marly S Camargo
(74) *Attorney, Agent, or Firm* — Rimon P.C.

(57) ABSTRACT

An imaging device includes a plurality of pixels and a voltage supply circuit. Each of the plurality of pixels includes: a pixel electrode; a counter electrode; a photoelectric conversion layer located between the pixel electrode and the counter electrode; and a charge blocking layer located between the pixel electrode and the photoelectric conversion layer. The charge blocking layer contains an impurity and has a first surface facing the photoelectric conversion layer and a second surface facing the pixel electrode. The concentration of the impurity on the first surface is higher than the concentration of the impurity on the second surface. The voltage supply circuit supplies a first voltage between the counter electrode and the pixel electrode in a first period and supplies a second voltage different from the first voltage between the counter electrode and the pixel electrode in a second period.

21 Claims, 7 Drawing Sheets

(51) Int. Cl.
    *H04N 25/709*     (2023.01)
    *H04N 25/76*     (2023.01)
    *H10F 39/12*     (2025.01)
    *H10K 39/32*     (2023.01)

(56) References Cited

U.S. PATENT DOCUMENTS

| | | | |
|---|---|---|---|
| 2018/0151608 A1 | 5/2018 | Tashiro | |
| 2018/0294316 A1* | 10/2018 | Tokuhara | H10K 85/311 |
| 2020/0295285 A1 | 9/2020 | Kaneda et al. | |
| 2021/0335889 A1* | 10/2021 | Momose | H10K 39/32 |
| 2023/0403479 A1* | 12/2023 | Sato | H04N 25/65 |
| 2024/0298096 A1* | 9/2024 | Iijima | H04N 25/70 |
| 2024/0305895 A1* | 9/2024 | Iijima | H04N 25/532 |

\* cited by examiner

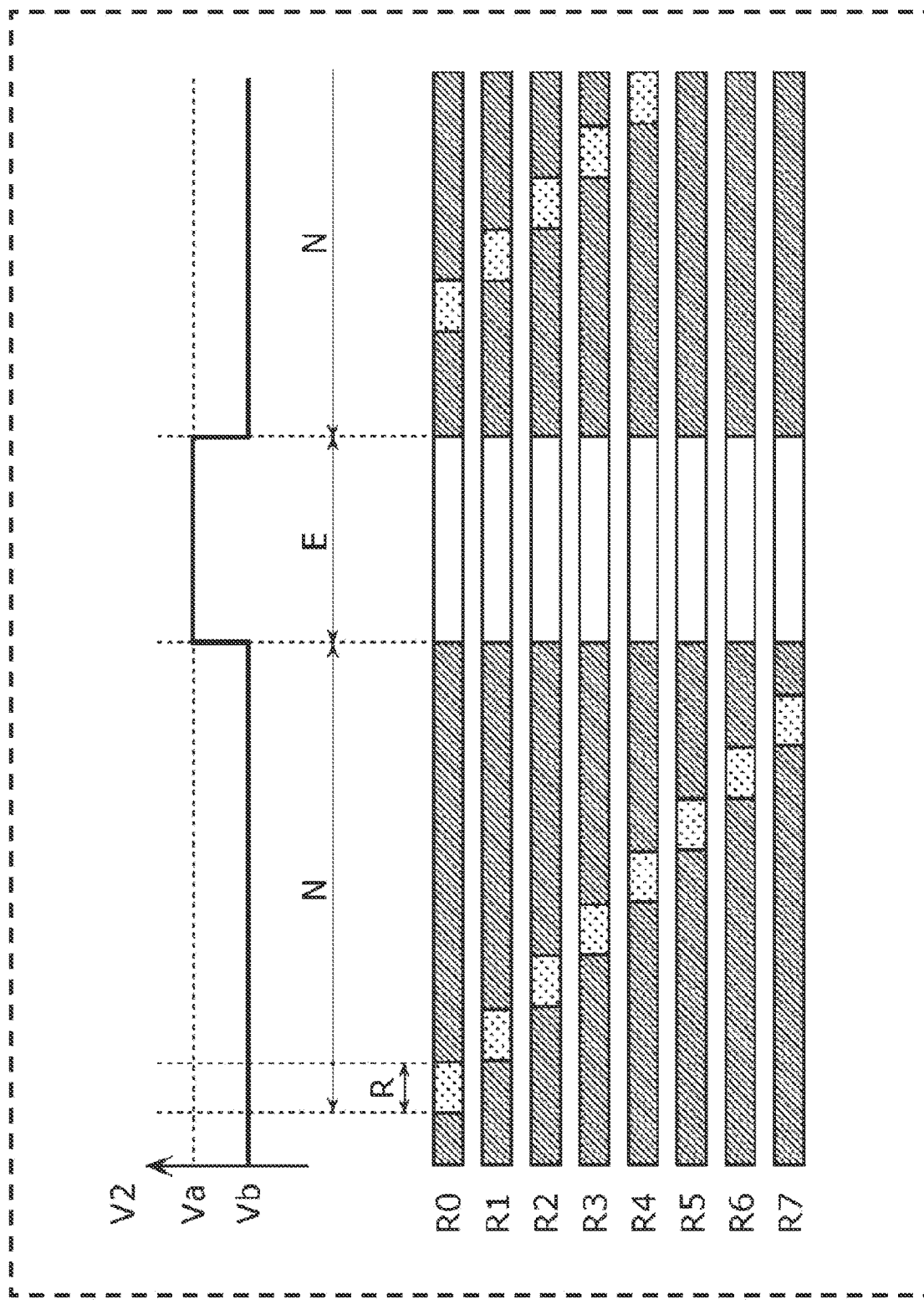

IMAGING DEVICE AND DRIVING METHOD

BACKGROUND

1. Technical Field

The present disclosure relates to an imaging device and a method for driving pixels.

2. Description of the Related Art

Organic semiconductor materials have physical properties, functions, etc. that conventional inorganic semiconductor materials such as silicon do not have and have been actively studied as semiconductor materials that can provide novel semiconductor devices and electronic devices.

For example, photoelectric conversion elements that use organic semiconductor materials as photoelectric conversion materials have been studied. A photoelectric conversion element extracts electrons or holes generated by photoelectric conversion as signal charges and can be used, for example, for an imaging device. There is a demand for the photoelectric conversion element in, for example, an imaging device to efficiently extract charges generated by photoelectric conversion to an electrode and to prevent a backflow of charges from the electrode.

To meet the above demand, for example, Japanese Patent No. 5969843 and International Publication No. WO2017/163923 propose methods in which a charge blocking layer is used in a photoelectric conversion element. The charge blocking layer prevents a backflow of charges from an electrode when a bias voltage is applied to the photoelectric conversion element and selectively transports electrons or holes generated by photoelectric conversion to the electrode to thereby increase charge extraction efficiency.

Japanese Patent No. 5969843 proposes a photoelectric conversion element in which an electrode, an electron blocking layer, a hole transport auxiliary layer, a donor layer formed of a donor material, an acceptor layer formed of an acceptor material, an electron transport auxiliary layer, a hole blocking layer, and an electrode are stacked in this order to effectively extract charges. In the photoelectric conversion element described in Japanese Patent No. 5969843, the ionization potential decreases in the following order: the electron blocking layer>the hole transport auxiliary layer>the donor layer.

International Publication No. WO2017/163923 proposes a photoelectric conversion element in which an electron blocking layer is disposed between an electrode and a photoelectric conversion layer in order to extract charges efficiently and in which the absolute value of the ionization potential of the electron blocking layer has a local maximum between the photoelectric conversion layer and the boundary between the electron blocking layer and the electrode. International Publication No. WO2017/163923 discloses, in one embodiment, a technique in which a layer with a high impurity concentration is used for the electron blocking layer to bend the band of the electron blocking layer so as to be convex upward.

CMOS (Complementary Metal Oxide Semiconductor) image sensors including photodiodes are widely used as optical sensors. Features of the CMOS image sensors include low power consumption and accessibility to individual pixels. The CMOS image sensors including photodiodes generally use, as a signal reading method, a so-called rolling shutter in which exposure and reading of signal charges are performed on a pixel array sequentially on a row-by-row basis.

In the rolling shutter, the start and end timings of exposure differ for different rows in the pixel array. Therefore, when an image of an object moving at high speed is captured, the image of the object may be distorted, or, when a flash is used, unevenness in brightness may occur in the image. In view of the foregoing circumstances, there is currently an increasing demand for a so-called global shutter function in which the start and end timings of exposure are the same for all the pixels in the pixel array.

For example, Japanese Unexamined Patent Application Publication No. 2018-92990 discloses a method for achieving the global shutter function using a photoelectric conversion element using an organic material thin film. In this method, a first bias voltage that causes signal charges generated in the photoelectric conversion material to migrate to pixel electrodes is applied to electrodes connected to opposite ends of the photoelectric conversion element, and a second bias voltage different from the first voltage is applied in order to prevent migration of electrons and holes when a signal detection circuit reads the moved signal charges.

SUMMARY

In one general aspect, the techniques disclosed here feature an imaging device including: a plurality of pixels; and a voltage supply circuit. Each of the plurality of pixels includes: a pixel electrode; a counter electrode; a photoelectric conversion layer that is located between the pixel electrode and the counter electrode and that generates an electron and a hole; and a charge blocking layer located between the pixel electrode and the photoelectric conversion layer. The charge blocking layer contains an impurity and has a first surface facing the photoelectric conversion layer and a second surface facing the pixel electrode. The concentration of the impurity on the first surface is higher than the concentration of the impurity on the second surface. The voltage supply circuit supplies a first voltage between the counter electrode and the pixel electrode in a first period and supplies a second voltage different from the first voltage between the counter electrode and the pixel electrode in a second period.

In another general aspect, the techniques disclosed here feature a driving method for driving the plurality of pixels in the imaging device described above. The method includes: applying, between the counter electrode and the pixel electrode, a voltage that causes the potential of the counter electrode relative to the pixel electrode to be positive; and applying, between the counter electrode and the pixel electrode, a voltage that causes the potential of the counter electrode relative to the pixel electrode to be negative.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 9 is a timing chart showing an example of a voltage supplied to the upper electrode of the photoelectric conversion unit in the embodiment and operation timings of rows in a pixel array.

Figure 1:
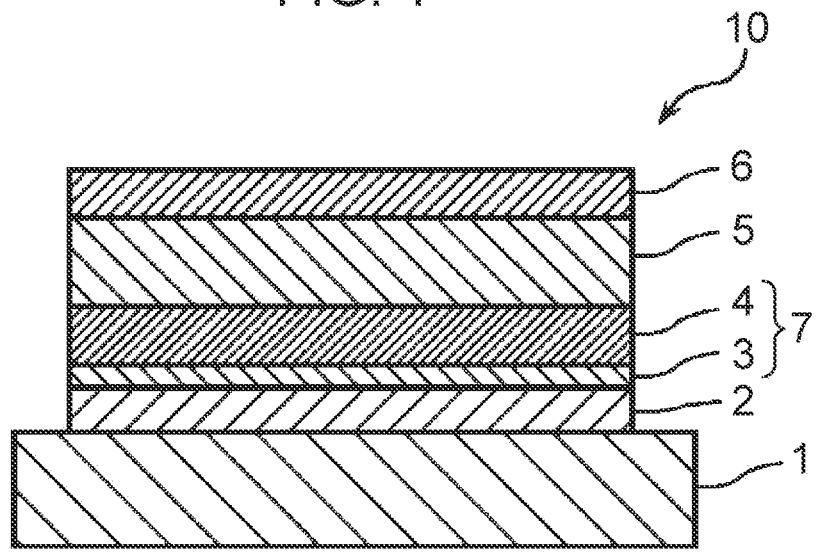
FIG. 1 is a schematic cross-sectional view showing an example of a photoelectric conversion element according to an embodiment.

DETAILED DESCRIPTIONS (Underlying Knowledge Forming Basis of Embodiments of the Present Disclosure)

When two different bias voltages are applied as in the case of the global shutter function disclosed in Japanese Unexamined Patent Application Publication No. 2018-92990, an improvement in the S/N ratio is desired. The S/N ratio can be improved when, for example, both the following two features are achieved. First, at the timing at which a first bias voltage for causing signal charges to migrate to pixel electrodes is applied to a photoelectric conversion element, the signal charges are efficiently extracted while the migration of charges with a polarity opposite to the polarity of the signal charges to a photoelectric conversion layer is prevented. Second, at the timing at which a second bias voltage for preventing the migration of electrons and holes is applied to the photoelectric conversion element, the amount of charges migrating from the pixel electrodes to the photoelectric conversion element and generating noise is as small as possible. The first bias voltage and the second bias voltage differ in, for example, polarity.

However, Japanese Unexamined Patent Application Publication No. 2018-92990 does not disclose the structure of a photoelectric conversion element that is effective in improving the S/N ratio. In Japanese Patent No. 5969843 and International Publication No. WO2017/163923 also, it is not stated that the structures disclosed in these documents are applied to the case in which two different bias voltages are applied to the photoelectric conversion element, and there is no reference to a structure of the photoelectric conversion element that is effective in improving the S/N ratio.

The present disclosure has been made based on the above findings and provides an imaging device etc. that can improve the S/N ratio during imaging when two bias voltages with different polarities are applied.

(Overview of the Present Disclosure)

Aspects of the present disclosure are as follows.

An imaging device according to one aspect of the present disclosure includes: a plurality of pixels; and a voltage supply circuit. Each of the plurality of pixels includes: a pixel electrode; a counter electrode; a photoelectric conversion layer that is located between the pixel electrode and the counter electrode and that generates an electron and a hole; and a charge blocking layer located between the pixel electrode and the photoelectric conversion layer. The charge blocking layer contains an impurity and has a first surface facing the photoelectric conversion layer and a second surface facing the pixel electrode. The concentration of the impurity on the first surface is higher than the concentration of the impurity on the second surface. The voltage supply circuit supplies a first voltage between the counter electrode and the pixel electrode in a first period and supplies a second voltage different from the first voltage between the counter electrode and the pixel electrode in a second period.

In this case, the voltage supply circuit can apply, between the counter electrode and the pixel electrode, a voltage that causes the potential of the counter electrode relative to the pixel electrode to be positive and also a voltage that causes the potential of the counter electrode relative to the pixel electrode to be negative. Therefore, when the voltage that causes the potential of the counter electrode relative to the pixel electrode to be positive is applied between the counter electrode and the pixel electrode, the charge blocking layer included in the pixel serves as resistance to electrons, and injection of the electrons from the pixel electrode to the photoelectric conversion layer can be reduced. When the voltage that causes the potential of the counter electrode relative to the pixel electrode to be negative is applied between the counter electrode and the pixel electrode, the energy band in a portion of the charge blocking layer that is close to the first surface and the energy band in the photoelectric conversion layer are bent, so that the electric field applied to a portion of the charge blocking layer that is close to the second surface in contact with the pixel electrode is reduced. Therefore, a backflow of holes from the pixel electrode to the photoelectric conversion layer can be reduced. Thus, the noise can be reduced.

When the first voltage is supplied between the counter electrode and the pixel electrode, the potential difference between the counter electrode and the pixel electrode may become a first potential difference. When the second voltage is supplied between the counter electrode and the pixel electrode, the potential difference between the counter electrode and the pixel electrode may become a second potential difference.

For example, the photoelectric conversion efficiency of the plurality of pixels in the first period may differ from the photoelectric conversion efficiency of the plurality of pixels in the second period.

In this case, even when the first voltage and the second voltage that change the current density differently according to the amount of light incident on the photoelectric conversion layer are selected in the first period and the second period, respectively, the S/N ratio during imaging can be improved because the imaging device includes the charge blocking layer as described above.

For example, the imaging device may be operated in a global shutter mode in which each of the plurality of pixels has an exposure period in the same period. The exposure period is a period for storing one of the electron and the hole generated in the photoelectric conversion layer.

Since all the pixels can be subjected to exposure at the same timing as described above, the occurrence of phenomena specific to the rolling shutter such as distortion of the image of the object can be prevented, and the S/N ratio during imaging can be improved.

For example, the first period may be the exposure period, and the second period may be a non-exposure period other than the exposure period during the operation of the imaging device.

In the above global shutter mode, the second period is the non-exposure period for signal reading.

For example, when the second voltage is supplied between the counter electrode and the pixel electrode, the electron and the hole in the photoelectric conversion layer may be recombined.

In this case, the second voltage that allows the electron and the hole to be recombined is supplied during the second period. Therefore, when the second period, which is the non-exposure period, is used as the signal reading period, the density of the current generated in the photoelectric conversion layer during the non-exposure period is unlikely to be influenced by the amount of light incident on the photoelectric conversion layer.

For example, when the first voltage is supplied between the counter electrode and the pixel electrode, the photoelectric conversion layer may exhibit sensitivity to photoelectric conversion.

Since the voltage that allows the photoelectric conversion layer to exhibit sensitivity is supplied in the first period serving as the exposure period as described above, the S/N ratio during imaging can be improved.

For example, the voltage supply circuit may selectively apply, between the counter electrode and the pixel electrode, a voltage that causes the potential of the counter electrode relative to the pixel electrode to be positive or negative.

Even when the voltage that causes the potential of the counter electrode relative to the pixel electrode to be positive or negative is selectively applied between the counter electrode and the pixel electrode as described above, the S/N ratio during imaging can be improved because the imaging device includes the charge blocking layer as described above.

For example, the charge blocking layer may include a first layer containing a first material and a second layer containing a second material and doped with the impurity. The first layer may be in contact with the pixel electrode, and the second layer may be located between the first layer and the photoelectric conversion layer.

For example, the first layer may have a smaller thickness than the second layer.

In this case, since the second layer in which holes can easily migrate is thicker than the first layer, the holes can be more efficiently extracted.

For example, the first layer may have a larger thickness than the second layer.

In this case, the injection of electrons from the pixel electrode to the photoelectric conversion layer and the backflow of holes from the pixel electrode to the photoelectric conversion layer can be further reduced.

For example, the second layer may be in contact with the photoelectric conversion layer.

In this case, since the photoelectric conversion layer can be stacked directly on the second layer, the pixels of the imaging device can be produced efficiently.

For example, the charge blocking layer may further include a third layer that is located between the second layer and the photoelectric conversion layer and that contains a third material.

In this case, the injection of electrons from the pixel electrode to the photoelectric conversion layer and the backflow of holes from the pixel electrode to the photoelectric conversion layer can be further reduced.

For example, the second layer may contain a counter anion.

In this case, the doped state of the charge blocking layer is stabilized.

For example, the first layer may have a thickness larger than or equal to 10 nm.

In this case, the injection of electrons from the pixel electrode to the photoelectric conversion layer and the backflow of holes from the pixel electrode to the photoelectric conversion layer can be further reduced.

For example, the first layer may have a carrier density lower than $1E16/cm^3$, i.e., lower than $1\times10^{16}$ $cm^{-3}$.

In this case, the injection of electron from the pixel electrode to the photoelectric conversion layer and the backflow of holes from the pixel electrode to the photoelectric conversion layer can be further reduced.

For example, the second layer may have a thickness larger than or equal to 10 nm.

In this case, the injection of electrons from the pixel electrode to the photoelectric conversion layer can be further reduced. Even when the second layer is thick, migration of holes from the photoelectric conversion layer to the lower electrode is unlikely to be inhibited because the second layer is doped with the impurity.

For example, the second layer may have a carrier density higher than or equal to $1E16/cm^3$, i.e., higher than or equal to $1\times10^{16}$ $cm^{-3}$.

In this case, the resistance of the second layer to holes is further reduced, and the holes can be extracted more efficiently.

For example, the charge blocking layer may be an electron blocking layer. The photoelectric conversion layer may contain an acceptor material. The energy level of a lowest unoccupied molecular orbital (LUMO) of the charge blocking layer may be lower than the energy level of a lowest unoccupied molecular orbital (LUMO) of the acceptor material.

For example, the impurity may be an acceptor impurity.

In this case, since the second layer is doped with the acceptor impurity, the resistance of the second layer to holes is reduced. Therefore, when the voltage that causes the potential of the counter electrode relative to the pixel electrode to be positive is applied between the counter electrode and the pixel electrode, holes generated in the photoelectric conversion layer can easily migrate from the photoelectric conversion layer to the pixel electrode and can be extracted efficiently. Thus, in the imaging device according to the present aspect, the S/N ratio during imaging can be improved.

For example, each of the plurality of pixels may further include an amplifying transistor, and the pixel electrode may be connected to the amplifying transistor.

A driving method according to another aspect of the present disclosure is a driving method for driving the plurality of pixels in the imaging device described above. The method includes: applying, between the counter electrode and the pixel electrode, a voltage that causes the potential of the counter electrode relative to the pixel electrode to be positive; and applying, between the counter electrode and the pixel electrode, a voltage that causes the potential of the counter electrode relative to the pixel electrode to be negative.

As described above, in the driving method according to the present aspect of the present disclosure, the voltage that causes the potential of the counter electrode relative to the pixel electrode to be positive or negative is selectively applied between the counter electrode and the pixel electrode. Each pixel includes the electron blocking layer including the first layer and the second layer as described above. Therefore, even when the above driving method is performed, the injection of electrons from the pixel electrode to the photoelectric conversion layer and the backflow of holes from the pixel electrode to the photoelectric conversion layer can be reduced, and the hole can be efficiently extracted. Thus, with the driving method according to the present aspect, the S/N ratio during imaging can be improved.

Embodiments will next be described with reference to the drawings.

The embodiments described below show general or specific examples. Numerical values, shapes, components, arrangement positions and connections of the components, steps, the order of the steps, etc. shown in the following embodiments are merely examples and are not intended to limit the present disclosure. Among the components in the following embodiments, components not described in an independent claim will be described as optional components. The drawings are not necessarily strictly accurate illustrations. Therefore, the scales etc. in the drawings do not always agree with each other. In the drawings, the same reference numerals are given to substantially the same components, and redundant description thereof will be omitted or simplified.

In the present specification, terms representing the relations between components, terms representing the shapes of components, and numerical ranges do not represent only their strict meanings but are intended to include those in substantially the same range, e.g., with a few percent difference.

In the present specification, the terms "above" and "below" do not refer to an upward direction (vertically above) and a downward direction (vertically below) in space recognition in an absolute manner but are used to define relative positional relations based on the stacking order in a stack structure. Specifically, the light receiving side of the imaging device is defined as an "upper side," and the side opposite to the light receiving side is defined as a "lower side." The terms "above" and "below" are used merely to designate the mutual arrangement of components and are not intended to limit their postures during use of the imaging device. The terms "above" and "below" are used not only when two components are disposed with a space therebetween and another component is present between the two components but also when two components are disposed in contact with each other.

Embodiments

[Photoelectric Conversion Element]

A photoelectric conversion element included in an imaging device according to an embodiment will be described using FIG. 1. The photoelectric conversion element according to the present embodiment is a photoelectric conversion element of the charge reading type.

FIG. 1 is a schematic cross-sectional view showing an example of the photoelectric conversion element 10 according to the present embodiment. The photoelectric conversion element 10 is supported by a support substrate 1 and includes a pair of electrodes including an upper electrode 6 and a lower electrode 2, a photoelectric conversion layer 5 located between the upper electrode 6 and the lower electrode 2, and an electron blocking layer 7 located between the lower electrode 2 and the photoelectric conversion layer 5. The electron blocking layer 7 has a multilayer structure including a plurality of electron blocking layers stacked together. The electron blocking layer 7 includes an electron blocking layer 3 located between the lower electrode 2 and the photoelectric conversion layer 5 and in contact with the lower electrode 2 and an electron blocking layer 4 located between the electron blocking layer 3 and the photoelectric conversion layer 5 and doped with an acceptor impurity. In the present embodiment, the lower electrode 2 is an example of the pixel electrode when the photoelectric conversion element 10 is used for an imaging device, and the upper electrode 6 is an example of the counter electrode when the photoelectric conversion element 10 is used for the imaging device. The electron blocking layer 3 is an example of the first layer, and the electron blocking layer 4 is an example of the second layer.

The components of the photoelectric conversion element 10 according to the present embodiment will be described.

The support substrate 1 may be any substrate used to support a general photoelectric conversion element and may be, for example, a glass substrate, a quartz substrate, a semiconductor substrate, a plastic substrate, etc.

The lower electrode 2 is formed of a metal, a metal nitride, a metal oxide, or polysilicon having electric conductivity imparted thereto. Examples of the metal include aluminum, copper, titanium, and tungsten. Examples of the method for imparting electric conductivity to polysilicon include doping with an impurity.

The upper electrode 6 is, for example, a transparent electrode formed of a transparent electrically conductive material. The material of the upper electrode 6 is, for example, a transparent conducting oxide (TCO). Examples of the TCO include ITO (Indium Tin Oxide), IZO (Indium Zinc Oxide), AZO (Aluminum-doped Zinc Oxide), FTO (Fluorine-doped Tin Oxide), $SnO_2$, and $TiO_2$. The upper electrode 6 may be produced using TCO, one metal material such as aluminum (Al) or gold (Au), or an appropriate combination of a plurality of metal materials according to a desired transmittance.

The material of the lower electrode 2 and the material of the upper electrode 6 are not limited to the electrically conductive materials described above, and any other material may be used.

To produce the lower electrode 2 and the upper electrode 6, any of various methods may be used according to the material used. For example, when ITO is used, an electron beam method, a sputtering method, a resistance heating thermal evaporation method, a chemical reaction method such as a sol-gel method, a coating method using a dispersion of indium tin oxide, etc. may be used. In this case, ITO films may be formed and then subjected to UV-ozone treatment, a plasma treatment, etc. to produce the lower electrode 2 and the upper electrode 6.

The photoelectric conversion layer 5 is produced, for example, using an organic semiconductor material. To produce the photoelectric conversion layer 5, for example, a wet method such as a coating method using spin coating or a dry method such as a vacuum deposition method may be used. The vacuum deposition method is a method in which a material for a layer is heated in a vacuum to vaporize the material and the vaporized material is deposited on a substrate. The photoelectric conversion layer 5 is, for example, a mixture film having a bulk hetero structure containing a donor organic semiconductor material and an acceptor organic semiconductor material. The photoelectric conversion layer 5 may be a stacked film including a plurality of films formed of the donor organic semiconductor material and the acceptor organic semiconductor material. Specific examples of the donor organic semiconductor material and the acceptor organic semiconductor material will be shown below.

Examples of the donor organic semiconductor material include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, naphthalocyanine compounds, subphthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (such as naphthalene derivatives, anthracene derivatives, phenanthrene derivatives, tetracene derivatives, pyrene derivatives, perylene derivatives, and fluoranthene derivatives), and metal complexes including a nitrogen-containing heterocyclic compound as a ligand.

Examples of the acceptor organic semiconductor material include fullerenes (such as C60 fullerene and C70 fullerene), fullerene derivatives (such as PCBM (phenyl $C_{61}$ butyric acid methyl ester) and ICBA (indene $C_{60}$ bisadduct)), fused aromatic carbocyclic compounds (such as naphthalene derivatives, anthracene derivatives, phenanthrene derivatives, tetracene derivatives, pyrene derivatives, perylene derivatives, and fluoranthene derivatives), 5- to 7-membered heterocyclic compounds containing a nitrogen atom, an oxygen atom, or a sulfur atom (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), polyarylene compounds, fluorene compounds, cyclopentadiene compounds, silyl compounds, and metal complexes including a nitrogen-containing heterocyclic compound as a ligand.

The donor organic semiconductor material and the acceptor organic semiconductor material are not limited to the above examples. Any low-molecular weight or high-molecular weight organic compound may be used as the material forming the photoelectric conversion layer 5 so long as the organic compound can be used to form the photoelectric conversion layer 5 using a dry or wet method.

A semiconductor material other than the above-described donor organic semiconductor materials and acceptor organic semiconductor materials may be used for the photoelectric conversion layer 5. The semiconductor material may be, for example, a silicon semiconductor, a compound semiconductor, quantum dots, a perovskite material, carbon nanotubes, etc. or may be a mixture of two or more of them.

The photoelectric conversion element 10 according to the present embodiment includes the electron blocking layer 7 including the electron blocking layer 3 and the electron blocking layer 4 doped with the acceptor impurity. The electron blocking layer 7 transports holes generated in the photoelectric conversion layer 5 to the lower electrode 2. Moreover, the electron blocking layer 7 has the function of preventing electrons generated in the photoelectric conversion layer 5 from being transported to the lower electrode 2 and preventing electrons from migrating from the lower electrode 2. The electron blocking layer 3 is in contact with the lower electrode 2. The electron blocking layer 4 is in contact with the electron blocking layer 3 and is not in contact with the lower electrode 2.

The electron blocking layer 4 is in contact with the photoelectric conversion layer 5. In this case, the photoelectric conversion layer 5 can be stacked directly on the electron blocking layer 4, and therefore the photoelectric conversion element 10 can be produced efficiently.

Since the photoelectric conversion element 10 includes the electron blocking layer 3 and the electron blocking layer 4, the following effects are obtained. For example, when a voltage for extracting charges is applied between the upper electrode 6 and the lower electrode 2, the signal charges can be extracted efficiently while injection of charges with a polarity opposite to the polarity of the signal charges from the lower electrode 2 to the photoelectric conversion layer 5 is reduced. For example, the signal charge extraction efficiency is higher than that when the photoelectric conversion element 10 includes only an electron blocking layer 3 having the same thickness as the total thickness of the above-described electron blocking layers 3 and 4. When a voltage that causes the extraction of the charges to be stopped is applied between the upper electrode 6 and the lower electrode 2, a backflow of the charges from the lower electrode 2 to the photoelectric conversion layer 5 can be reduced, and the amount of noise signals that adversely affect the S/N ratio can be reduced. Therefore, in the photoelectric conversion element 10, the S/N ratio during imaging can be improved. In the present embodiment, the signal charges are positive charges, e.g., holes, and the charges with a polarity opposite to the polarity of the signal charges are negative charges, e.g., electrons. The details of the electron blocking layer 3 and the electron blocking layer 4 will next be described.

The electron blocking layer 3 contains the first material as a main component. The electron blocking layer 3 is formed of, for example, the first material. The electron blocking layer 4 contains the second material as a main component and is doped with the acceptor impurity. The electron blocking layer 4 is formed of, for example, the second material doped with the acceptor impurity.

The first material and the second material may be the same material or may be different materials. The first material and the second material are, for example, organic semiconductor materials. The organic semiconductor materials used as the first material and the second material may be, for example, any of the materials exemplified as the organic semiconductor material used for the photoelectric conversion layer 5 described above. The first material and the second material are not limited to the organic semiconductor materials. Each of the first and second materials may be a semiconductor material such as an oxide semiconductor or a nitride semiconductor or may be a composite material containing at least one of these materials.

The acceptor impurity used may be, for example, a compound that accepts electrons from the second material.

No particular limitation is imposed on the method for forming the electron blocking layer 3. For example, the electron blocking layer 3 is formed by vapor deposition of the first material or by applying the first material dissolved in a solvent.

No particular limitation is imposed on the method for forming the electron blocking layer 4. For example, the electron blocking layer 4 is formed by vapor co-deposition of the second material and the acceptor impurity. Examples of the acceptor impurity used for the film formation by vapor co-deposition include acceptor inorganic materials such as molybdenum trioxide and acceptor organic materials such as 2,3,6,7,10,11-hexacyano-1,4,5,8,9,12-hexaazatriphenylene (HATCN). Alternatively, the electron blocking layer 4 is formed, for example, by dissolving the second material and the acceptor impurity in a solvent and applying the mixture. Examples of the acceptor impurity used for the film formation by application include triarylboron compounds, halogenated metals, Lewis acids, organic acids, onium salts, salts of arylamines and halogenated metals, and salts of arylamines and Lewis acids. Any of these compounds may be used alone, or a combination of two or more may be used.

The electron blocking layer 4 may contain counter anions. In this case, when the electron blocking layer 4 is formed by application, the doped state of the second material is stabilized. The counter anions are contained in the compound used as the acceptor impurity for doping. Specific examples of the compound used as the counter anion-containing acceptor impurity include organic group-substituted onium salts such as 4-isopropyl-4'-methyldiphenyliodonium tetrakis(pentafluorophenyl)borate and triphenylsulfonium tetrafluoroborate.

No particular limitation is imposed on the concentration of the acceptor impurity in the electron blocking layer 4 so long as it is higher than the concentration of the acceptor impurity in the electron blocking layer 3. The concentration of the acceptor impurity in the electron blocking layer 4 is, for example, a concentration that allows a carrier density described below to be achieved. A specific example of the concentration is higher than or equal to 0.1% by mass and lower than or equal to 50% by mass based on the mass of the second material in the electron blocking layer 4. The carrier density in the doped electron blocking layer 4 is, for example, higher than or equal to 1E16/cm$^3$, i.e., higher than or equal to $1 \times 10^{16}$ cm$^{-3}$, and may be higher than or equal to 1E17/cm$^3$, i.e., higher than or equal to $1 \times 10^{17}$ cm$^3$, from the viewpoint of extracting holes used as signal charges efficiently to thereby improve the S/N ratio.

To reduce the injection of electrons from the lower electrode 2 to the photoelectric conversion layer 5 and the backflow of holes from the lower electrode 2 to the photoelectric conversion layer 5, the electron blocking layer 3 contains, for example, substantially no acceptor impurity and is not doped with the acceptor impurity. Specifically, the carrier density in the electron blocking layer 3 is, for example, lower than 1E16/cm$^3$, i.e., lower than $1 \times 10^{16}$ cm$^{-3}$.

The thickness of the electron blocking layer 3 is, for example, larger than or equal to 10 nm. In this case, the injection of electrons from the lower electrode 2 to the photoelectric conversion layer 5 and the backflow of holes from the lower electrode 2 to the photoelectric conversion layer 5 can be further reduced. The thickness of the electron blocking layer 3 is, for example, smaller than or equal to 200 nm. In this case, a reduction in the signal charge extraction efficiency can be prevented.

As shown in FIG. 1, the thickness of the electron blocking layer 3 may be smaller than the thickness of the electron blocking layer 4. In this case, since the electron blocking layer 4 in which holes can easily migrate is large, holes can be extracted more efficiently. The thickness of the electron blocking layer 3 may be smaller than or equal to one half of the thickness of the electron blocking layer 4.

The thickness of the electron blocking layer 3 may be larger than the thickness of the electron blocking layer 4. In this case, the injection of electrons from the lower electrode 2 to the photoelectric conversion layer 5 and the backflow of holes from the lower electrode 2 to the photoelectric conversion layer 5 can be further reduced. The thickness of the electron blocking layer 3 may be the same as the thickness of the electron blocking layer 4.

The thickness of the electron blocking layer 4 may be, for example, larger than or equal to 10 nm. In this case, since the electron blocking layer 4 is thick, the injection of electrons from the lower electrode 2 to the photoelectric conversion layer 5 can be reduced. Even when the electron blocking layer 4 is thick, the resistance to holes is unlikely to increase because the electron blocking layer 4 is doped with the acceptor impurity, so that the migration of holes from the photoelectric conversion layer 5 to the lower electrode 2 is unlikely to be inhibited. The thickness of the electron blocking layer 4 is, for example, smaller than or equal to 500 nm.

The photoelectric conversion element 10 may further include a hole blocking layer that is not shown in FIG. 1 and is disposed between the upper electrode 6 and the photoelectric conversion layer 5. The hole blocking layer transports electrons generated in the photoelectric conversion layer 5 to the upper electrode 6. The hole blocking layer prevents transportation of holes generated in the photoelectric conversion layer 5 to the upper electrode 6 and migration of holes from the upper electrode 6. An organic semiconductor material, for example, is used for the hole blocking layer.

Figure 2:
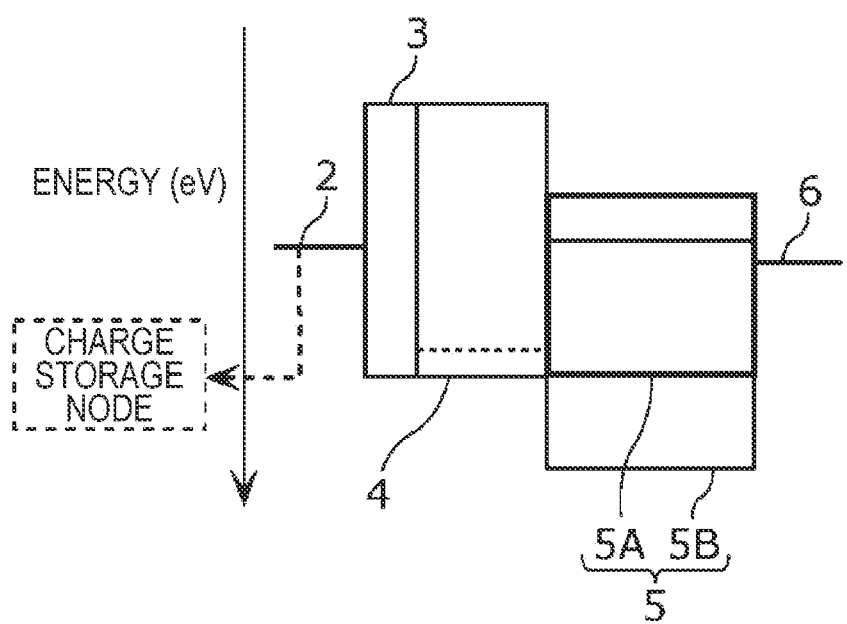
FIG. 2 is an exemplary energy band diagram of the photoelectric conversion element according to the embodiment.

FIG. 2 is an exemplary energy band diagram in the photoelectric conversion element 10 shown in FIG. 1. In FIG. 2, the energy band of each layer is shown by a rectangle.

The photoelectric conversion layer 5 generates electron-hole pairs under irradiation with light. The generated electron-hole pairs are separated into electron and holes at the interface between the donor organic semiconductor material and the acceptor organic semiconductor material in the photoelectric conversion layer 5. The electrons and holes under the electric field migrate toward the lower electrode 2 or the upper electrode 6. A material that donates the electrons in electron-hole pairs generated by light absorption to the other material is referred to as the donor material, and a material that accepts the electrons is referred to as the acceptor material. When two different organic semiconductor materials are used in the photoelectric conversion layer 5, which of them serves as the donor material and which of them serves as the acceptor material are generally determined by the relative positions of the HOMO (Highest Occupied Molecular Orbital) and LUMO (Lowest Unoccupied Molecular Orbital) energy levels of the two organic semiconductor materials at the contact interface. In each rectangle in FIG. 2 that represents an energy band, the upper edge is the LUMO energy level, and the lower edge is the HOMO energy level. Among the donor organic semiconductor material and the acceptor organic semiconductor material contained in the photoelectric conversion layer 5, the material that has a shallower LUMO energy level for accepting an electron is a donor material 5A, and the material having a deeper LUMO energy level is an acceptor material 5B, as shown in FIG. 2. The donor organic semiconductor material is the donor material 5A, and the acceptor organic semiconductor material is the acceptor material 5B. In the present specification, an energy level located at an upper position in FIG. 2 is referred to as a shallow energy level, and an energy level located at a lower position in FIG. 2 is referred to as a deep energy level. Specifically, the energy difference between a shallow energy level and the vacuum level is small, and the energy difference between a deep energy level and the vacuum level is large.

In FIG. 2, the Fermi level of the electron blocking layer 4 doped with the acceptor impurity is indicated by a broken line.

For example, when the photoelectric conversion element 10 is used for an imaging device, the lower electrode 2 is electrically connected to a charge storage node described later, as shown in FIG. 2.

As for the HOMO energy levels of the electron blocking layers 3 and 4, for example, the differences between the HOMO energy level of the donor material 5A and the HOMO energy levels of the electron blocking layers 3 and 4 are less than or equal to 0.5 eV. In this case, in the photoelectric conversion element 10, holes can be extracted efficiently, and the backflow of holes from the lower electrode 2 to the photoelectric conversion layer 5 can also be reduced. The difference between the HOMO energy level of the electron blocking layer 3 and, for example, the HOMO energy level of the electron blocking layer 4 is less than or equal to 0.5 eV. In this case, holes can be extracted efficiently, and the injection of electrons from the lower electrode 2 to the photoelectric conversion layer 5 can also be reduced.

The LUMO energy levels of the electron blocking layers 3 and 4 are shallower than, for example, the LUMO energy level of the acceptor material 5B of the photoelectric conversion layer 5. The difference between the Fermi level of the electron blocking layer 4 and, for example, the HOMO energy level of the donor material 5A is less than or equal to 0.5 eV.

The energy band structure shown in FIG. 2 can be obtained, for example, by selecting the materials of the layers exemplified above according to the energy bands of the materials of the layers.

Figure 3:
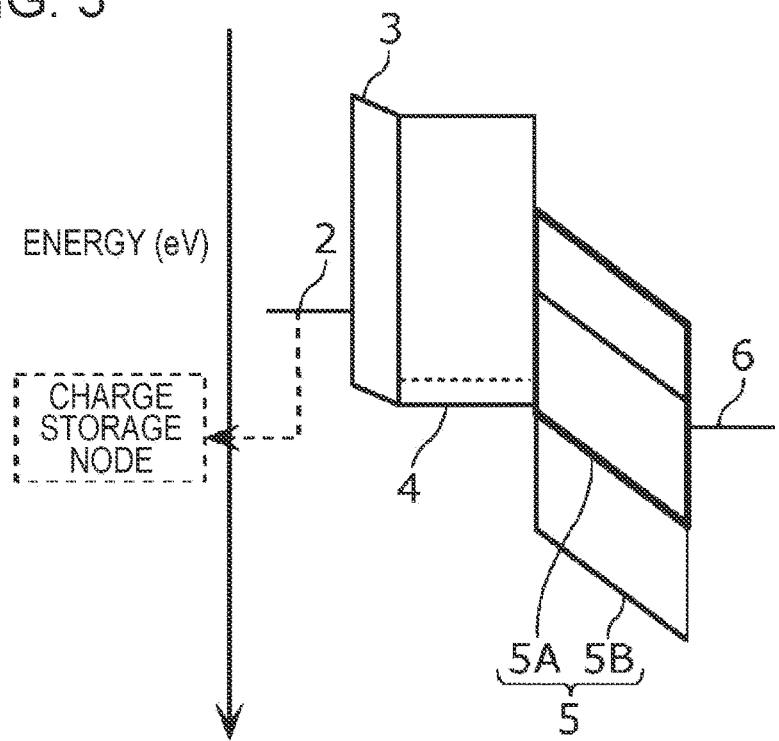
FIG. 3 is an exemplary energy band diagram of the photoelectric conversion element according to the embodiment when a reverse bias voltage is applied between a lower electrode and an upper electrode.
Figure 4:
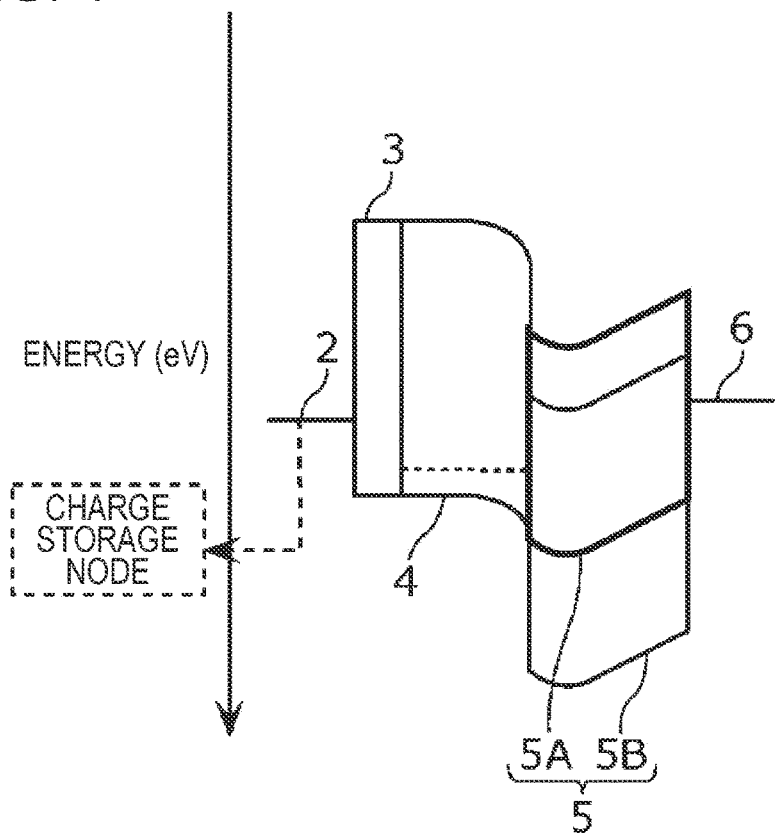
FIG. 4 is an energy band diagram of the photoelectric conversion element according to the embodiment when a forward bias voltage is applied between the lower electrode and the upper electrode.

FIG. 3 is an exemplary energy band diagram in the photoelectric conversion element 10 when a reverse bias voltage is applied between the lower electrode 2 and the upper electrode 6. FIG. 4 is an exemplary energy band diagram in the photoelectric conversion element 10 when a forward bias voltage is applied between the lower electrode 2 and the upper electrode 6. In the present specification, the voltage applied to the photoelectric conversion element 10, specifically the voltage applied between the lower electrode 2 and the upper electrode 6, is referred to as a bias voltage. When the voltage applied to the upper electrode 6 is higher than the voltage applied to the lower electrode 2, the voltage applied between the lower electrode 2 and the upper electrode 6 is a reverse direction bias voltage. When the voltage applied to the upper electrode 6 is lower than the voltage applied to the lower electrode 2, the voltage applied between the lower electrode 2 and the upper electrode 6 is a forward direction bias voltage. In the following description, the reverse direction bias voltage may be referred to as the reverse bias voltage, and the forward direction bias voltage may be referred to as the forward bias voltage.

For example, when the imaging device using the photoelectric conversion element 10 stores signal charges, electron-hole pairs are generated in the photoelectric conversion layer 5 in the state shown in FIG. 3. Then, since the voltage applied to the upper electrode 6 is higher than the voltage applied to the lower electrode 2, the holes migrate to the lower electrode 2, and the electrons migrate to the upper electrode 6, so that the holes are stored in the charge storage node. The electron blocking layer 4 has been doped with the acceptor impurity and has high hole conductivity. In other words, the electron blocking layer 4 has low resistance to holes and is unlikely to inhibit transportation of the holes. Therefore, although the photoelectric conversion element 10 includes the electron blocking layer 4, the holes migrate to the lower electrode 2 efficiently. Because of the influence of the reverse bias voltage, electrons attempt to flow from the lower electrode 2 to the photoelectric conversion layer 5. However, since the photoelectric conversion element 10 includes the electron blocking layer 7 having the two-layer structure including the electron blocking layer 3 and the electron blocking layer 4, the effect of reducing the injection of electrons from the lower electrode 2 to the photoelectric conversion layer 5 is higher than that of an electron blocking layer having a single layer structure.

For example, when the imaging device using the photoelectric conversion element 10 reads signal charges, the holes stored in the charge storage node through the lower electrode 2 are read in the state shown in FIG. 4. Because of the influence of the forward bias voltage, the electrons generated in the photoelectric conversion layer 5 attempt to flow to the lower electrode 2. However, since the photoelectric conversion element 10 includes the electron blocking layer 7 having the two-layer structure including the electron blocking layer 3 and the electron blocking layer 4, the effect of reducing the injection of electrons from the photoelectric conversion layer 5 to the lower electrode 2 is higher than that of an electron blocking layer having a single layer structure. The amount of the backflow of holes from the lower electrode 2 to the photoelectric conversion layer 5 due to the influence of the forward bias voltage depends on, for example, the electric field applied to the electron blocking layer 3 in which holes can migrate less easily than in the electron blocking layer 4. As shown in FIG. 4, the energy band in the photoelectric conversion layer 5 and the energy band in the electron blocking layer 4 doped with the acceptor impurity are bent, and the electric field applied to the electron blocking layer 3 is thereby reduced. In this case, the backflow of the holes stored in the charge storage node from the lower electrode 2 to the photoelectric conversion layer 5 is reduced during reading of the signal charges. For example, when the electron blocking layer 4 is not provided, the energy band of the electron blocking layer 3 in FIG. 4 is inclined upward toward the right. Therefore, the HOMO energy level serving as a barrier for the migration of holes is inclined upward toward the right and is shallower on the photoelectric conversion layer 5 side, and the effect of reducing the backflow of the holes stored in the charge storage node is reduced.

As described above, the photoelectric conversion element 10 included in the imaging device according to the present embodiment includes the electron blocking layer 7 including the electron blocking layer 3 and the electron blocking layer 4 described above. In this case, in the photoelectric conversion element 10 in which the holes captured through the lower electrode 2 are read, with the forward bias voltage applied between the lower electrode 2 and the upper electrode 6, the backflow of holes from the lower electrode 2 to the photoelectric conversion layer 5 during signal reading can be effectively reduced. Moreover, in the photoelectric conversion element 10, with the reverse bias voltage applied between the lower electrode 2 and the upper electrode 6, the holes can be extracted efficiently while the injection of electrons from the lower electrode 2 to the photoelectric conversion layer 5 is reduced.

Figure 5:
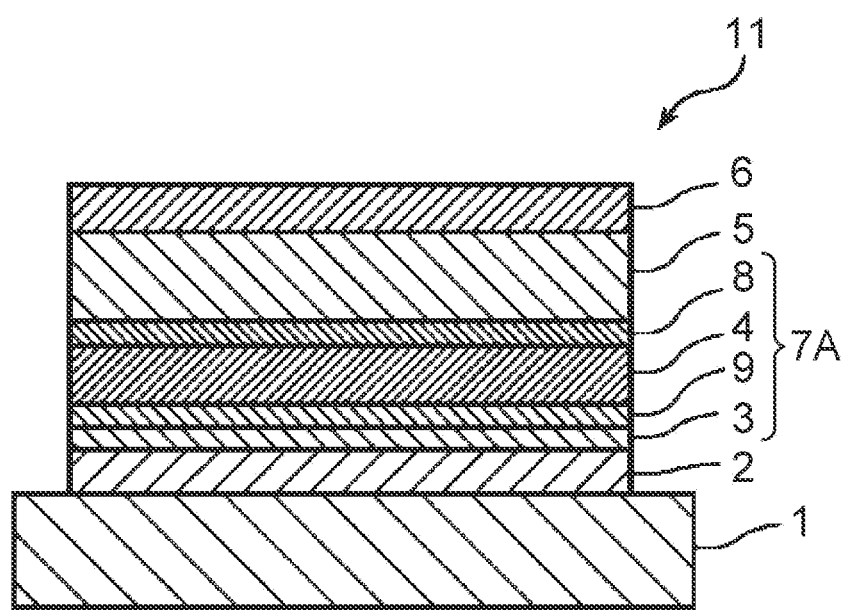
FIG. 5 is a schematic cross-sectional view showing another example of the photoelectric conversion element according to the embodiment.

The electron blocking layer 7 has the two-layer structure including the electron blocking layer 3 and the electron blocking layer 4, but this is not a limitation. The electron blocking layer 7 may include an electron blocking layer other than the electron blocking layer 3 and the electron blocking layer 4. FIG. 5 is a schematic cross-sectional view showing a photoelectric conversion element 11 that is another example of the photoelectric conversion element 10 according to the present embodiment.

The photoelectric conversion element 11 has the same structure as the structure of the photoelectric conversion element 10 except that an electron blocking layer 7A is provided instead of the electron blocking layer 7. The electron blocking layer 7A includes, in addition to the electron blocking layer 3 and the electron blocking layer 4 included in the electron blocking layer 7, an electron blocking layer 8 and an electron blocking layer 9. The electron blocking layer 8 is an example of the third layer. Since the electron blocking layer 7A includes the electron blocking layer 8 and the electron blocking layer 9, the injection of charges with a polarity opposite to the polarity of the signal charges from the lower electrode 2 to the photoelectric conversion layer 5 and the backflow of the signal charges from the lower electrode 2 to the photoelectric conversion layer 5 can be further reduced. One of the electron blocking layer 8 and the electron blocking layer 9 may not be included in the electron blocking layer 7A.

The electron blocking layer 8 is located between the electron blocking layer 4 and the photoelectric conversion layer 5. The electron blocking layer 8 contains the third material as a main component. The electron blocking layer 8 may be formed of, for example, the third material. The electron blocking layer 8 may be doped with an acceptor impurity.

The electron blocking layer 9 is located between the electron blocking layer 4 and the electron blocking layer 3. The electron blocking layer 9 contains, for example, a fourth material as a main component. The electron blocking layer 9 may be formed of, for example, the fourth material. The electron blocking layer 9 may be doped with an acceptor impurity.

The third material and the fourth material are, for example, any of the materials exemplified in the description of the first and second materials. The third material and the fourth material may be the same as at least one of the first and second materials or may be different from the first and second materials.

[Imaging Device]

Figure 6:
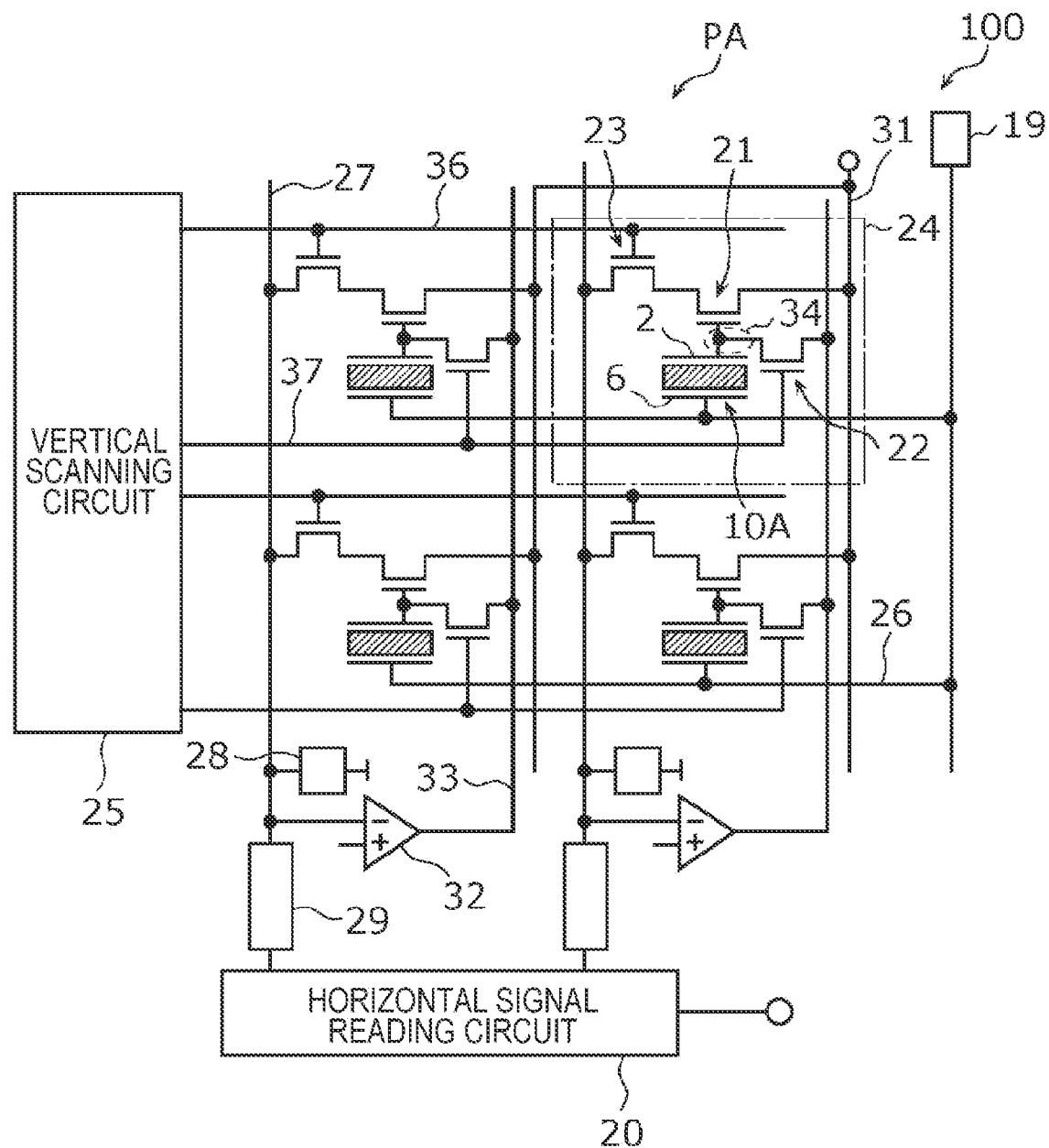
FIG. 6 is an illustration showing an example of the circuit structure of an imaging device according to an embodiment.
Figure 7:
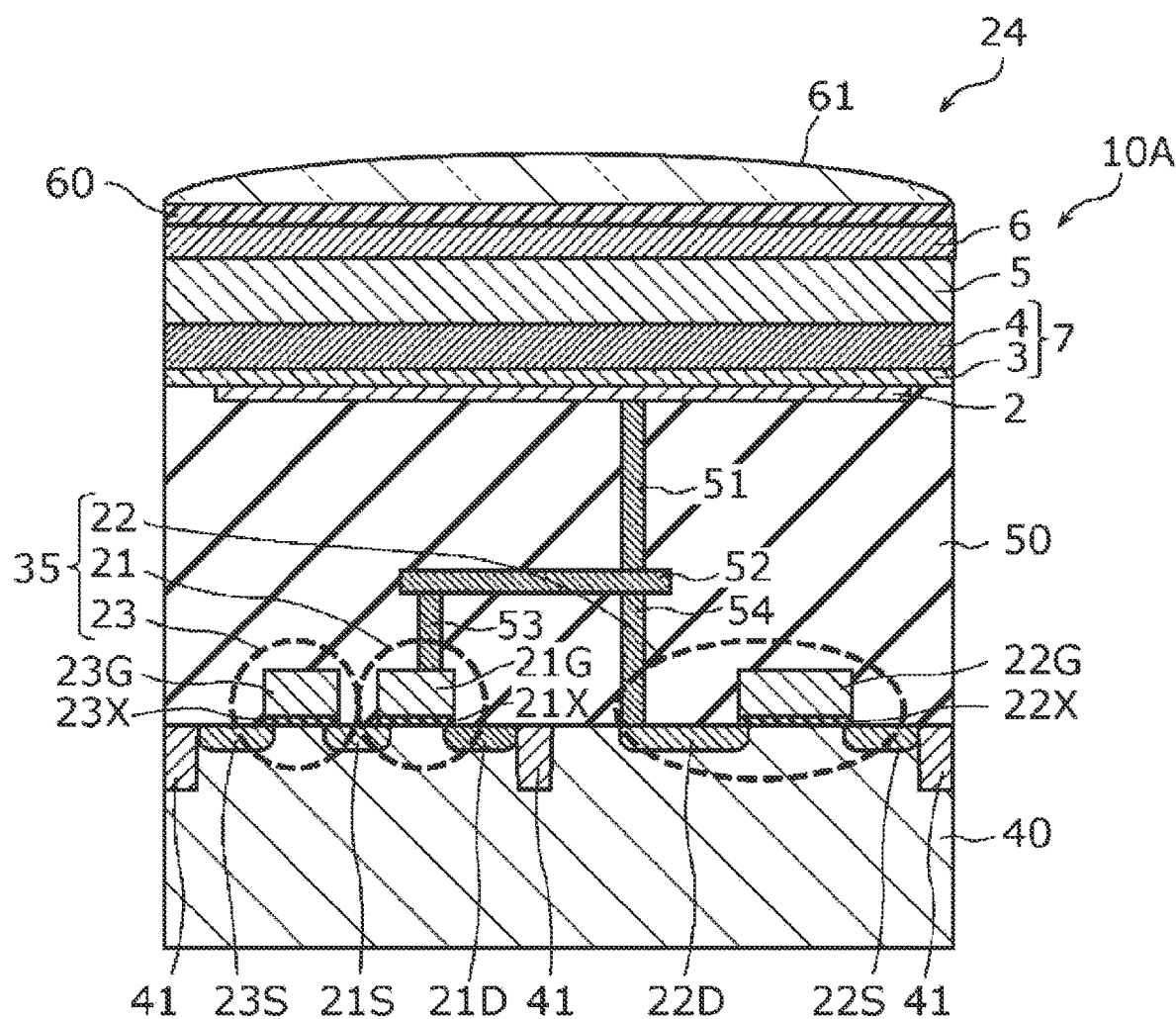
FIG. 7 is a schematic cross-sectional view showing an example of the device structure of a pixel in the imaging device according to the embodiment.

FIG. 6 is an illustration showing an example of the circuit structure of an imaging device 100 including photoelectric conversion units 10A each using the photoelectric conversion element 10 shown in FIG. 2. FIG. 7 is a schematic cross-sectional view showing an example of the device structure of a pixel 24 in the imaging device 100 according to the present embodiment.

As shown in FIGS. 6 and 7, the imaging device 100 according to the present embodiment includes: a semiconductor substrate 40 that is an example of the substrate; and pixels 24. Each pixel 24 includes: a charge detection circuit 35 provided for the semiconductor substrate 40; a photoelectric conversion unit 10A disposed on the semiconductor substrate 40; and a charge storage node 34 electrically connected to the charge detection circuit 35 and the photoelectric conversion unit 10A. The photoelectric conversion unit 10A in each pixel 24 includes the photoelectric conversion element 10 described above. The photoelectric conversion unit 10A includes the upper electrode 6, the lower electrode 2, the photoelectric conversion layer 5, and the electron blocking layer 7 including the electron blocking layer 3 and the electron blocking layer 4. The photoelectric conversion unit 10A may include another photoelectric conversion element such as the photoelectric conversion element 11 instead of the photoelectric conversion element 10.

The charge storage node 34 is electrically connected to the lower electrode 2 of the photoelectric conversion unit 10A and stores charges obtained in the photoelectric conversion unit 10A. The charge storage node 34 is referred to also as a charge storage region. The charge detection circuit 35 detects the charges stored in the charge storage node 34. The charge detection circuit 35 provided for the semiconductor substrate 40 may be disposed on the semiconductor substrate 40 or may be disposed directly in the semiconductor substrate 40.

As shown in FIG. 6, the imaging device 100 includes the plurality of pixels 24 and peripheral circuits. The imaging device 100 is, for example, an organic image sensor implemented as a one chip integrated circuit and includes a pixel array PA including the plurality of pixels 24 arranged two-dimensionally. The imaging device 100 is, for example, an imaging device operated in a global shutter mode in which the same exposure period is applied to all of the plurality of pixels 24. Specifically, the imaging device 100 has a global shutter function. The details of the exposure period will be described later.

The plurality of pixels 24 are arranged two-dimensionally, i.e., in row and column directions, on the semiconductor substrate 40 to form a photosensitive region serving as a pixel region. In the example shown in FIG. 6, the pixels 24 are arrange in a matrix of two rows and two columns. In FIG. 6, the illustration of a circuit for setting the sensitivities of the pixels 24 independently (for example, a pixel electrode control circuit) is omitted for convenience of illustration. The imaging device 100 may be a line sensor. In this case, the plurality of pixels 24 may be arranged one dimensionally. In the present specification, the row and column directions are the extending directions of the rows and columns, respectively. Specifically, the vertical direction, i.e., the longitudinal direction, in FIG. 6 is the column direction, and the horizontal direction, i.e., the lateral direction in FIG. 6, is the row direction.

As shown in FIGS. 6 and 7, each pixel 24 includes a photoelectric conversion unit 10A and a charge storage node 34 electrically connected to a charge detection circuit 35. The charge detection circuit 35 includes an amplifying transistor 21, a reset transistor 22, and an address transistor 23.

Each photoelectric conversion unit 10A includes a lower electrode 2 provided as a pixel electrode and an upper electrode 6 provided as a counter electrode. The photoelectric conversion unit 10A includes the photoelectric conversion element 10 described above. A prescribed bias voltage is supplied to the upper electrode 6 through a counter electrode signal line 26.

The lower electrode 2 is connected to a gate electrode 21G of the amplifying transistor 21, and signal charges collected by the lower electrode 2 are stored in the charge storage node 34 located between the lower electrode 2 and the gate electrode 21G of the amplifying transistor 21. In the present embodiment, the signal charges are holes.

The signal charges stored in the charge storage node 34 are applied to the gate electrode 21G of the amplifying transistor 21 as a voltage corresponding to the amount of the signal charges. The amplifying transistor 21 amplifies this voltage, and the amplified voltage is selectively read as a signal voltage by the address transistor 23. A source/drain electrode of the reset transistor 22 is connected to the lower electrode 2, and the reset transistor 22 resets the signal charges stored in the charge storage node 34. In other words, the reset transistor 22 resets the potential (voltage) of the gate electrode 21G of the amplifying transistor 21 and the potential (voltage) of the lower electrode 2.

To perform the above operation selectively for the plurality of pixels 24, the imaging device 100 includes power source lines 31, vertical signal lines 27, address signal lines 36, and reset signal lines 37. These lines are connected to the pixels 24. Specifically, the power source lines 31 are connected to source/drain electrodes of the amplifying transistors 21, and the vertical signal lines 27 are connected to source/drain electrodes of the address transistors 23. The address signal lines 36 are connected to gate electrodes 23G of the address transistors 23. The reset signal lines 37 are connected to gate electrodes 22G of the reset transistors 22.

The peripheral circuits include a voltage supply circuit 19, a vertical scanning circuit 25, a horizontal signal reading circuit 20, a plurality of column signal processing circuits 29, a plurality of load circuits 28, and a plurality of differential amplifiers 32.

The voltage supply circuit 19 is electrically connected to the upper electrodes 6 through counter electrode signal lines 26. The voltage supply circuit 19 applies a voltage to each upper electrode 6 such that the voltage causes a potential difference between the upper electrode 6 and the corresponding lower electrode 2. For example, the voltage supply circuit 19 supplies a first voltage to the upper electrode 6 in a first period such as an exposure period described later and supplies a second voltage different from the first voltage in a second period such as a non-exposure period. For example, the voltage supply circuit 19 selectively supplies, between the upper electrode 6 and the lower electrode 2, a voltage that causes the potential of the upper electrode 6 relative to the lower electrode 2 to be positive or negative. Specifically, one of the first voltage and the second voltage is a voltage that causes the potential of the upper electrode 6 relative to the lower electrode 2 to be positive, and the other one is a voltage that causes the potential of the upper electrode 6 relative to the lower electrode 2 to be negative. For example, in the exposure period described later, the voltage supply circuit 19 applies, between the upper electrode 6 and the lower electrode 2, the first voltage that causes the potential of the upper electrode 6 relative to the lower electrode 2 to be positive. For example, in the non-exposure period described later, the voltage supply circuit 19 applies, between the upper electrode 6 and the lower electrode 2, the second voltage that causes the potential of the upper electrode 6 relative to the lower electrode 2 to be negative.

The vertical scanning circuit 25 is connected to the address signal lines 36 and the reset signal lines 37, selects any of the rows of pixels 24, reads signal voltages from the selected pixels, and resets the potential of each of the lower electrodes 2. The power source lines 31 each serving as a source-follower power source supply a prescribed power source voltage to the pixels 24. The horizontal signal reading circuit 20 is electrically connected to the plurality of column signal processing circuits 29. The column signal processing circuits 29 are electrically connected to their respective columns of pixels 24 through the respective vertical signal lines 27. The load circuits 28 are electrically connected to the respective vertical signal lines 27. The load circuits 28 and the amplifying transistors 21 form source follower circuits.

The plurality of differential amplifiers 32 are provided for the respective columns. Negative input terminals of the differential amplifiers 32 are connected to the respective vertical signal lines 27. Output terminals of the differential amplifiers 32 are connected to pixels 24 through feedback lines 33 provided for their respective columns.

The vertical scanning circuit 25 applies a row selection signal to the gate electrode 23G of each address transistor 23 through its corresponding address signal line 36 to control the ON/OFF of the address transistor 23. In this manner, the row to be read is scanned and selected. Signal voltages are read from pixels 24 in the selected row through the respective vertical signal lines 27. The vertical scanning circuit 25 also applies a reset signal to the gate electrode 22G of each reset transistor 22 through the corresponding reset signal line 37 to control the ON/OFF of the reset transistor 22. In this manner, the row of unit pixels 24 to be reset is selected. The vertical signal lines 27 transmit the signal voltages read from the pixels 24 selected by the vertical scanning circuit 25 to the respective column signal processing circuits 29.

The column signal processing circuits 29 perform noise suppression signal processing typified by correlated double sampling, analog-digital conversion (A/D conversion), etc.

The horizontal signal reading circuit 20 sequentially reads signals from the plurality of column signal processing circuits 29 and outputs the signals to a horizontal common signal line (not shown).

The differential amplifiers 32 are connected through the feedback lines 33 to the drain electrodes of the reset transistors 22. Therefore, the differential amplifiers 32 receive, on their negative terminals, output values of the respective address transistors 23. Each differential amplifier 32 performs a feedback operation such that the gate potential of the corresponding amplifying transistor 21 is equal to a prescribed feedback voltage. In this case, the output voltage value of the differential amplifier 32 is 0 V or a positive voltage near 0 V. The feedback voltage means the output voltage of the differential amplifier 32.

As shown in FIG. 7, each pixel 24 includes the semiconductor substrate 40, the charge detection circuit 35, the photoelectric conversion unit 10A, and the charge storage node 34 (see FIG. 6).

The semiconductor substrate 40 may be, for example, an insulating substrate having a semiconductor layer disposed on its surface on the side on which the photosensitive region is to be formed. The semiconductor substrate 40 is, for example, a p-type silicon substrate. The semiconductor substrate 40 includes impurity regions 21D, 21S, 22D, 22S, and 23S and element isolation regions 41 for electrically isolating pixels 24 from each other. The impurity regions 21D, 21S, 22D, 22S, and 23S are, for example, n-type regions. In the present embodiment, an element isolation region 41 is disposed between the impurity region 21D and the impurity region 22D. Therefore, leakage of the signal charges stored in the charge storage node 34 is prevented. Each element isolation region 41 is formed, for example, by implantation of acceptor ions under prescribed implantation conditions.

The impurity regions 21D, 21S, 22D, 22S, and 23S are, for example, diffusion regions formed in the semiconductor substrate 40. As shown in FIG. 7, the amplifying transistor 21 includes the impurity region 21S, the impurity region 21D, and the gate electrode 21G. The impurity region 21S and the impurity region 21D function, for example, as a source region and a drain region, respectively, of the amplifying transistor 21. A channel region of the amplifying transistor 21 is formed between the impurity region 21S and the impurity region 21D.

Similarly, the address transistor 23 includes the impurity region 23S, the impurity region 21S, and the gate electrode 23G connected to one of the address signal lines 36. In this example, the amplifying transistor 21 and the address transistor 23 share the impurity region 21S and are thereby electrically connected to each other. The impurity region 23S functions, for example, as a source region of the address transistor 23. The impurity region 23S is connected to one of the vertical signal lines 27 shown in FIG. 6.

The reset transistor 22 includes the impurity regions 22D and 22S and the gate electrode 22G connected to one of the reset signal lines 37. The impurity region 22S functions, for example, as a source region of the reset transistor 22. The impurity region 22S is connected to one of the reset signal lines 37 shown in FIG. 6.

An interlayer insulating layer 50 is stacked on the semiconductor substrate 40 so as to cover the amplifying transistor 21, the address transistor 23, and the reset transistor 22.

Wiring layers not illustrated in FIG. 7 may be disposed in the interlayer insulating layer 50. The wiring layers are formed of a metal such as copper and may include wiring lines such as the above-described vertical signal lines 27 as part thereof. The number of insulating layers in the interlayer insulating layer 50 and the number of wiring layers disposed in the interlayer insulating layer 50 may be freely set.

Contact plugs 53, 54, and 51 and a wiring line 52 are disposed in the interlayer insulating layer 50. The contact plug 53 is connected to the gate electrode 21G of the amplifying transistor 21, and the contact plug 54 is connected to the impurity region 22D of the reset transistor 22. The contact plug 51 is connected to the lower electrode 2, and the wiring line 52 connects the contact plug 51, the contact plug 54, and the contact plug 53 to each other. In this manner, the impurity region 22D of the reset transistor 22 is electrically connected to the gate electrode 21G of the amplifying transistor 21. In the structure exemplified in FIG. 7, the contact plugs 51, 53, and 54, the wiring line 52, the gate electrode 21G of the amplifying transistor 21, and the impurity region 22D of the reset transistor 22 form at least part of the charge storage node 34.

The charge detection circuit 35 detects the signal charges collected by the lower electrode 2 and outputs a signal voltage. The charge detection circuit 35 includes the amplifying transistor 21, the reset transistor 22, and the address transistor 23 and is formed on the semiconductor substrate 40.

The amplifying transistor 21 includes the impurity region 21D and the impurity region 21S that are formed in the semiconductor substrate 40 and function as a drain region and a source region, respectively, and further includes a gate insulating layer 21X formed on the semiconductor substrate 40 and the gate electrode 21G formed on the gate insulating layer 21X.

The reset transistor 22 includes the impurity region 22D and the impurity region 22S that are formed in the semiconductor substrate 40 and function as a drain region and a source region, respectively, and further includes a gate insulating layer 22X formed on the semiconductor substrate 40 and the gate electrode 22G formed on the gate insulating layer 22X.

The address transistor 23 includes the impurity regions 21S and 23S that are formed in the semiconductor substrate 40 and function as a drain region and a source region, respectively, and further includes a gate insulating layer 23X formed on the semiconductor substrate 40 and the gate electrode 23G formed on the gate insulating layer 23X. In the impurity region 21S, the amplifying transistor 21 and the address transistor 23 are connected in series.

The photoelectric conversion unit 10A described above is disposed on the interlayer insulating layer 50. In other words, in the present embodiment, the plurality of pixels 24 forming the pixel array PA are formed on the semiconductor substrate 40. The plurality of pixels 24 arranged two-dimensionally on the semiconductor substrate 40 form the photosensitive region. The distance between two pixels 24 adjacent to each other (i.e., the pixel pitch) may be, for example, about 2 μm.

The photoelectric conversion unit 10A has the structure of the photoelectric conversion element 10 described above. The plurality of pixels 24 have their respective lower electrodes 2. The electron blocking layer 3, the electron blocking layer 4, the photoelectric conversion layer 5, and the upper electrode 6 are shared by the plurality of pixels 24. Each of the plurality of pixels 24 may include at least one of a corresponding independent electron blocking layer 3, a corresponding independent electron blocking layer 4, a corresponding independent photoelectric conversion layer 5, and a corresponding independent upper electrode 6.

A color filter 60 is formed on the photoelectric conversion unit 10A, and a microlens 61 is formed on the color filter 60. The color filter 60 is formed, for example, as an on-chip color filter using patterning. The material of the color filter 60 is, for example, a photosensitive resin containing a dye or a pigment dispersed therein. The microlens 61 is formed, for example, as an on-chip microlens. The material of the microlens 61 is, for example, an ultraviolet sensitive material.

To produce the imaging device 100, a general semiconductor production process can be used. In particular, when a silicon substrate is used as the semiconductor substrate 40, various silicon semiconductor processes can be utilized to produce the imaging device 100.

Figure 8:
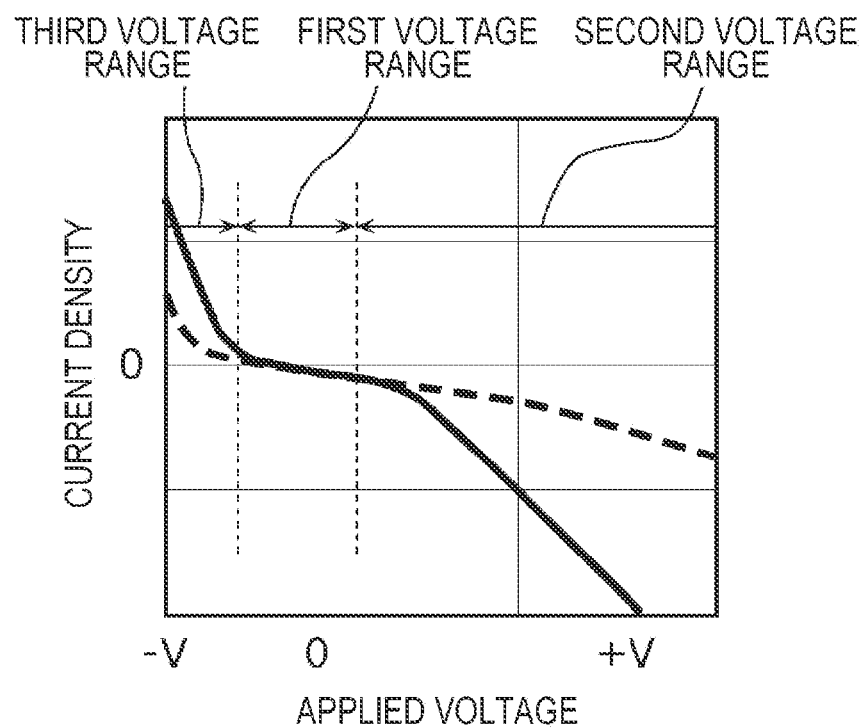
FIG. 8 is a graph showing an example of schematic current-voltage characteristics of a photoelectric conversion unit in the embodiment.

FIG. 8 is a schematic graph showing an example of the current-voltage (I-V) characteristics of the photoelectric conversion unit 10A. In FIG. 8, a thick solid graph line represents the exemplary I-V characteristics of the photoelectric conversion unit 10A when a voltage is applied between the lower electrode 2 and the upper electrode 6 under irradiation with light. In FIG. 8, an example of the I-V characteristics of the photoelectric conversion unit 10A when a voltage is applied between the lower electrode 2 and the upper electrode 6 without irradiation with light is shown by a thick broken line. In the following description, as in the above case, a voltage that causes the potential of the upper electrode 6 relative to the lower electrode 2 to be positive is a reverse bias voltage, and a voltage that cause the potential to be negative is a forward bias voltage.

As shown in FIG. 8, the photoelectric current characteristics of the photoelectric conversion unit 10A in the present embodiment are broadly characterized by a first voltage range, a second voltage range, and a third voltage range.

In the first voltage range, the dependence of the change in a current flowing through the photoelectric conversion unit 10A on the voltage applied between the lower electrode 2 and the upper electrode 6 and on the amount of light incident on the photoelectric conversion layer 5 is small. Specifically, in the first voltage range, the difference between the value of the current flow when light is incident on the photoelectric conversion layer 5 and the value of the current flow when no light is incident on the photoelectric conversion layer 5 is considered to be small. In the first voltage range, even when hole-electron pairs are generated due to light incident on the photoelectric conversion layer 5, the holes and electrons may be separated from each other. However, even in this case, the holes and electrons are recombined through a trap level etc. during transportation in the photoelectric conversion layer 5 because the absolute value of the voltage applied between the lower electrode 2 and the upper electrode 6 is not large.

The first voltage range includes a forward bias voltage region. Specifically, the energy band diagram shown in FIG. 4 above corresponds to an energy band diagram when a voltage in the first voltage range is applied between the lower electrode 2 and the upper electrode 6 in the photoelectric conversion unit 10A. Since the photoelectric conversion unit 10A includes the electron blocking layer 3 and the electron blocking layer 4, the backflow of holes serving as the signal charges from the lower electrode 2 to the photoelectric conversion layer 5 can be reduced as compared to that when the photoelectric conversion unit 10A does not include these layers or includes only one of these layers, as described using FIG. 4. Since it is the electron blocking layer 3, not the electron blocking layer 4 in which holes can easily migrate, that is in contact with the lower electrode 2, the number of holes flowing from the lower electrode 2 to the photoelectric conversion layer 5 can be smaller than that when the positions of the electron blocking layer 3 and the electron blocking layer 4 in the photoelectric conversion unit 10A are reversed. For example, when the electron blocking layer 4 is in contact with the lower electrode 2, the backflow of holes from the lower electrode 2 to the photoelectric conversion layer 5 may be likely to occur because of the influence of the acceptor impurity used as the dopant. When the forward bias voltage is applied to the photoelectric conversion unit 10A as described above, it is importance not only that the photoelectric conversion unit 10A simply include the electron blocking layer 3 and the electron blocking layer 4 doped with the acceptor impurity but also that the electron blocking layer 3 and the electron blocking layer 4 be stacked such that the electron blocking layer 3 is in contact with the lower electrode 2.

The second voltage range in FIG. 8 is a reverse bias voltage range and is a region in which the absolute value of the output current density increases as the reverse bias voltage increases. Specifically, the second voltage range is a region in which the current value increases as the amount of light incident on the photoelectric conversion layer 5 and the bias voltage applied between the lower electrode 2 and the upper electrode 6 increase.

The energy band diagram shown in FIG. 3 above corresponds to an energy band diagram when a voltage in the second voltage range is applied between the lower electrode 2 and the upper electrode 6 in the photoelectric conversion unit 10A. Therefore, since the photoelectric conversion unit 10A includes the electron blocking layer 3 and the electron blocking layer 4, holes serving as the signal charges generated by photoelectric conversion in the photoelectric conversion layer 5 can be extracted efficiently while the injection of electrons from the lower electrode 2 to the photoelectric conversion layer 5 is reduced.

The third voltage range in FIG. 8 is a forward bias voltage range in which the absolute value of the forward bias voltage is larger than that in the forward bias voltage region in the first voltage range, and the output current density increases as the forward bias voltage increases. Specifically, the third voltage range is a region in which the current increases as the bias voltage applied between the lower electrode 2 and the upper electrode 6 increases even when no light is incident on the photoelectric conversion layer 5. More specifically, the third voltage range is a region in which the amount of holes migrating from the lower electrode 2 to the photoelectric conversion layer 5 increases as the bias voltage increases. The energy band diagram shown in FIG. 4 above corresponds also to an energy band diagram when a voltage in the third voltage range is applied between the lower electrode 2 and the upper electrode 6 in the photoelectric conversion unit 10A. Since the photoelectric conversion unit 10A includes the electron blocking layer 3 and the electron blocking layer 4, the backflow of holes from the lower electrode 2 to the photoelectric conversion layer 5 can be reduced as described above. Therefore, when the bias voltage is relatively low (i.e., close to 0 V), the current is unlikely to increase. In this case, the third voltage range is narrow, and the first voltage range is broad. Thus, although the details will be described later, the dynamic range of the imaging device 100 can be increased.

[Operation of Imaging Device]

Next, the operation of the imaging device 100 will be described with reference to FIGS. 6 and 9. Specifically, a method for driving the plurality of pixels 24 will be described. The method for driving the plurality of pixels 24 includes a first step and a second step described below. In the following description, holes are used as the signal charges as described above. The operation of the imaging device 100 is not limited to the example described below.

The voltage supply circuit 19 shown in FIG. 6 supplies different voltages to each upper electrode 6 through the corresponding counter electrode signal line 26 during different periods, i.e., the exposure period that is an example of the first period and the non-exposure period that is an example of the second period. Specifically, the voltage supply circuit 19 selectively applies, between the upper electrode 6 and the lower electrode 2, a voltage that causes the potential of the upper electrode 6 relative to the lower electrode 2 to be positive or negative in the exposure period and the non-exposure period. In the present specification, the "exposure period" means a period for storing holes or electrons generated by photoelectric conversion as signal charges in the charge storage node 34. Specifically, the "exposure period" may be referred to as a "charge storing period." In the present specification, a period other than the exposure period during the operation of the imaging device is referred to as the "non-exposure period." The "non-exposure period" may be a period in which light directed to the photoelectric conversion unit 10A is shielded or may be a period in which, although the photoelectric conversion unit 10A is irradiated with light, substantially no charges are stored in the charge storage node 34.

FIG. 9 is a timing chart showing an example of the voltage V2 supplied to the upper electrodes 6 of the photoelectric conversion units 10A and operation timings of rows of the pixel array PA of the imaging device 100. For ease of description, FIG. 9 shows the changes in the voltage V2 and exposure and signal reading timings for only rows R0 to R7 in the pixel array PA. A graph in the upper part of FIG. 9 shows an example of temporal changes in voltage V2. A graph in the lower part of FIG. 9 schematically shows examples of timings for reading periods, exposure periods, and non-exposure periods. In the lower part of FIG. 9, rectangles with a dot pattern each represent a reading period R. White rectangles each represent an exposure period E.

The rectangle with a dot pattern and diagonally shaded rectangles each represent a non-exposure period N.

First, in the initial state, the potential difference between the lower electrode 2 and the upper electrode 6 in each photoelectric conversion unit 10A, i.e., the bias voltage applied to the photoelectric conversion unit 10A, is set so as to fall within the first voltage range. In this case, the voltage V2 supplied from the voltage supply circuit 19 to the upper electrode 6 is assumed to be reference voltage Vb. The voltage of the charge storage node 34 is denoted by Vc, and the voltage Vc has been reset to the reference voltage Vb. The reference voltage Vb is, for example, from about 0 V to about 1 V. In this case, when the voltage applied to the photoelectric conversion unit 10A is denoted by bias voltage Vo, Vo=0 because V2=Vo+Vc.

Next, the operation in the exposure period E will be described. At the start of the exposure period E, the voltage supply circuit 19 supplies, to the upper electrode 6 of each photoelectric conversion unit 10A, voltage Va, which is an example of the first voltage, as the voltage V2 such that a voltage in the second voltage range, i.e., a reverse bias voltage, is applied to the photoelectric conversion unit 10A. Specifically, in the first step, the voltage supply circuit 19 applies, between the upper electrode 6 and the lower electrode 2, a voltage that causes the potential of the upper electrode 6 relative to the lower electrode 2 to be positive. For example, when the photoelectric conversion layer 5 is formed of an organic semiconductor material, the voltage Va is several V to a maximum of about 10 V. In this case, holes used as the signal charges are stored in the charge storage node 34 of each pixel 24 in an amount corresponding to the amount of light incident on the photoelectric conversion layer 5. As described above, in the exposure period E, the voltage supply circuit 19 supplies, to the upper electrode 6, the voltage Va that allows the electrons and holes in the photoelectric conversion layer 5 not to be recombined.

Next, the operation in the non-exposure period N will be described. After completion of the exposure period E, the voltage supply circuit 19 supplies, to the upper electrode 6 of each photoelectric conversion unit 10A, the reference voltage Vb, which is an example of the second voltage, as the voltage V2 such that a voltage in the first voltage range is applied to the photoelectric conversion unit 10A. Holes have been stored in the charge storage node 34 of each pixel 24 in an amount corresponding to the amount of light incident on the photoelectric conversion layer 5 in the exposure period E, and the values of the voltages Vc differ for different pixels 24. Vo=V2−Vc as described above. Therefore, in a pixel 24 not exposed to light, the voltage Vc is unchanged, and the bias voltage Vo is zero. However, in a pixel 24 with the voltage Vc changed, the bias voltage Vo is nonzero. Specifically, in the exposure period E, holes are stored in the charge storage node 34, and the voltage Vc of the charge storage node 34 increases from the reference voltage Vb set before the exposure period E. Therefore, by supplying the reference voltage Vb as the voltage V2 from the voltage supply circuit 19 to the upper electrode 6, the bias voltage Vo becomes a forward bias voltage. Specifically, in the second step, the voltage supply circuit 19 applies, between the upper electrode 6 and the lower electrode 2, a voltage that causes the potential of the upper electrode 6 relative to the lower electrode 2 to be negative. As described above, in the non-exposure period N, the voltage supply circuit 19 supplies, to the upper electrode 6, the reference voltage Vb that allows the electrons and holes in the photoelectric conversion layer 5 to be recombined.

When the first voltage range is sufficiently wide, even if the values of the voltages Vc differ for different pixels 24, the voltage V2 for each pixel 24 can be set such that the bias voltage Vo applied to the corresponding photoelectric conversion unit 10A falls within the first voltage range. Variations in the value of the voltage Vc correspond to the width of the dynamic range. For example, when the width of the first voltage range is equal to or larger than 0.5 V, a dynamic range wider than or equal to 80 dB that corresponds to that of human eyes can be obtained in an imaging device with a conversion gain of 50 μV/e⁻.

As described above, with the bias voltage in the first voltage range applied to the photoelectric conversion unit 10A of each pixel 24, holes are unlikely to migrate to the corresponding charge storage node 34 even when light is incident on the pixel 24. Moreover, the holes stored in the charge storage node 34 are unlikely to be discharged to the lower electrode 2, and holes supplied from the voltage supply circuit 19 are unlikely to flow into the charge storage node 34 through the lower electrode 2. Specifically, the voltage supply circuit 19 supplies a voltage to the upper electrodes 6 such that the photoelectric conversion efficiency of the plurality of pixels 24, i.e., the photoelectric conversion efficiency of the photoelectric conversion units 10A of the plurality of pixels 24, in the exposure period differs from that in the non-exposure period.

Therefore, in the non-exposure period N, the holes in each pixel 24 are held in the photoelectric conversion layer 5 while their amount corresponding to the amount of light incident on the photoelectric conversion layer 5 is maintained. Specifically, the holes in each pixel 24 can be held even when light is again incident on the photoelectric conversion layer 5 so long as the holes in the charge storage node 34 are not reset. In this case, even when the reading operation is performed row-by-row in the non-exposure period N, additional holes are not accumulated during the reading operation. Therefore, even when the global shutter operation described later is performed, rolling distortion, which is likely to occur in the rolling shutter mode, does not occur. Thus, the global shutter function can be obtained using a simple pixel circuit such as that for the pixels 24 without providing transfer transistors and additional storage capacity. Since the pixel circuit is simple, the pixels 24 in the imaging device 100 can be reduced in size advantageously.

Next, the global shutter operation in the imaging device 100 will be described using FIG. 9.

As described above, in the imaging device 100, the voltage supply circuit 19 supplies the reference voltage Vb to the upper electrode 6 of each photoelectric conversion unit 10A in the non-exposure period N such that the bias voltage Vo applied to the photoelectric conversion unit 10A is in the first voltage range. Specifically, in the non-exposure period N, the second step described above is performed. When holes have been stored in the charge storage node 34, the reference voltage Vb is, for example, smaller than or equal to the voltage Vc of the charge storage node 34 as described above. As shown in FIG. 9, in the non-exposure period N, the imaging device 100 reads signals in reading periods R of rows R0 to R7 sequentially at different timings. For example, in each reading period R, after the signals have been read, the holes stored in the corresponding charge storage node 34 are reset.

As described above, in the exposure period E, the voltage supply circuit 19 supplies the voltage Va to the upper electrode 6 of each photoelectric conversion unit 10A such that the bias voltage Vo applied to the photoelectric conversion unit 10A is in the second voltage range. Specifically, in the exposure period E, the first step described above is performed. The start and end timings of the exposure period E are the same for all the rows R0 to R7. Specifically, while signals are read sequentially, the global shutter function is achieved.

In the present embodiment, each of the photoelectric conversion units 10A in the imaging device 100 includes the electron blocking layer 3 and the electron blocking layer 4. The method for driving the photoelectric conversion units 10A includes the first step and the second step. Therefore, in the first step which is performed in the exposure period E etc. and in which a reverse bias voltage is applied to each photoelectric conversion unit 10A, the imaging device 100 can extract holes efficiently while the injection of electrons from the lower electrode 2 to the photoelectric conversion layer 5 is reduced. In the second step which is performed in the imaging device 100 in the non-exposure period N and in which a forward bias voltage is applied to each photoelectric conversion unit 10A, the backflow of holes from the lower electrode 2 can be reduced. Therefore, even when forward and reverse bias voltages are applied to the photoelectric conversion units 10A such as when the global shutter function is implemented, the S/N ratio of the imaging device 100 during imaging can be improved.

The photoelectric conversion element etc. used in the imaging device according to the present disclosure will be specifically described in the following Examples. However, the present disclosure is not at all limited to the following Examples.

Example 1

(Preparation of Solutions)

Materials used for the electron blocking layer 3 and the electron blocking layer 4 were prepared by the following procedure. VNPB (N4,N4'-di(naphthalen-1-yl)-N4,N4'-bis (4-vinylphenyl)biphenyl-4,4'-diamine manufactured by LUMTEC) was weighed, and chlorobenzene used as a solvent was added to prepare a first solution with a concentration of 10 mg/ml. Next, 10 mg of a dopant (4-isopropyl-4'-methyldiphenyliodonium tetrakis(pentafluorophenyl)borate) was weighed, and 1000 mL of chlorobenzene was added to prepare a second solution. 0.03 mL of the second solution was added to 1 mL of the first solution to thereby prepare a third solution.

(Production of Photoelectric Conversion Element)

A photoelectric conversion element was produced by the following procedure. The first solution was added dropwise onto a 0.7 mm-thick quartz glass substrate with a 150 nm ITO pattern formed thereon, and spin coating was performed to form a film. Next, the substrate with the film formed thereon was heated to 200° C. for 50 minutes using a hot plate. An undoped crosslinked electron blocking layer 3 was thereby produced. Next, the third solution was added dropwise onto the electron blocking layer 3, and spin coating was performed to form a film. Then, the substrate with the films formed thereon was heated to 200° C. for 50 minutes using a hot plate. A crosslinked electron blocking layer 4 doped with the acceptor impurity was thereby produced on the electron blocking layer 3. The thicknesses of the electron blocking layers 3 and 4 obtained were each about 50 nm.

Next, subphthalocyanine used as the donor organic semiconductor material and C60 fullerene used as the acceptor organic semiconductor material, i.e., the materials of the photoelectric conversion layer, were co-deposited at a weight ratio or 1:9 on the electron blocking layer 4 by vacuum vapor deposition to thereby form a photoelectric conversion layer. The thickness of the thus-obtained photoelectric conversion layer was about 500 nm. In the subphthalocyanine used, boron (B) is used as the central metal, and chloride ions serving as ligands are coordinated to B.

Next, an ITO film used as the upper electrode and having a thickness of 30 nm was formed on the photoelectric conversion layer by sputtering, and then an $Al_2O_3$ film used as a sealing film was formed on the upper electrode using an atomic layer deposition method to thereby obtain a photoelectric conversion element in Example 1.

Comparative Example 1

A photoelectric conversion element in Comparative Example 1 was obtained using the same procedure as in Example 1 except that, in the production of the photoelectric conversion element, the electron blocking layer 4 was not deposited.

Comparative Example 2

A photoelectric conversion element in Comparative Example 2 was obtained using the same procedure as in Example 1 except that, in the production of the photoelectric conversion element, the first solution was used for both the electron blocking layer 3 and the electron blocking layer 4.

Comparative Example 3

A photoelectric conversion element in Comparative Example 3 was obtained using the same procedure as in Example 1 except that, in the production of the photoelectric conversion element, the third solution instead of the first solution was used for the electron blocking layer 3 and the first solution instead of the third solution was used for the electron blocking layer 4.

(Measurement of Dark Current)

A dark current in each of the obtained photoelectric conversion elements was measured. A semiconductor device parameter analyzer B1500A (manufactured by Keysight Technologies) was used for the measurement. More specifically, the ITO electrode on the glass substrate side was used as a reference, and a dark current when a forward bias of −0.2 V was applied to the upper electrode was measured in a nitrogen atmosphere. A relative dark current that is the ratio with respect to the dark current in Comparative Example 1 was computed using the following formula (1).

$$\text{(Relative dark current)} = \text{(dark current value in photoelectric conversion element)}/\text{(dark current value in Comparative Example 1)} \quad (1)$$

(Measurement of Spectral Sensitivity)

The spectral sensitivity of the photoelectric conversion element in each of Example 1 and Comparative Examples 1 to 3 was measured. Specifically, in a glove box under a nitrogen atmosphere, the photoelectric conversion element was introduced into a sealable measurement jig, and the spectral sensitivity was measured using a spectral sensitivity measurement device (manufactured by Bunkoukeiki Co. Ltd.). In this case, external quantum efficiency for light of 450 nm was measured with a reverse bias of 5 V applied. The relative external quantum efficiency that is the ratio with respect to the quantum efficiency in Comparative Example 1 was computed using the following formula (2).

$$\text{(Relative external quantum efficiency)} = \text{(external quantum efficiency of photoelectric conversion element)}/\text{(external quantum efficiency in Comparative Example 1)} \quad (2)$$

(Evaluation Results)

Table 1 shows the results of the measurement of the relative dark current and the relative external quantum efficiency in the photoelectric conversion element in each of Example 1 and Comparative Examples 1 to 3. As shown in Table 1, in Example 1, since the amount of charges injected from the electrodes during application of the forward bias was small, the dark current was small. Since the resistance of the doped electron blocking layer was small, the external quantum efficiency was high. In Comparative Example 2, although the dark current was small, the external quantum efficiency was low because the resistance of the electron blocking layer was high. In Comparative Example 3, although the external quantum efficiency was high, the dark current was large because charges were easily injected from the electrodes during the application of the forward bias.

TABLE 1

| | Electron blocking layer 3 | Electron blocking layer 4 | Relative dark current | Relative external quantum efficiency |
|---|---|---|---|---|
| Example 1 | First solution | Third solution | 0.08 | 0.98 |
| Comparative example 1 | First solution | (None) | 1.00 | 1.00 |
| Comparative example 2 | First solution | First solution | 0.40 | 0.66 |
| Comparative example 3 | Third solution | First solution | 0.47 | 1.02 |

As can be seen, with the method of the present disclosure, a small dark current and high external quantum efficiency during application of a forward bias can be achieved simultaneously, and a global shutter function with a high S/N ratio can be achieved.

The imaging device according to the present disclosure has been described based on the embodiments, but the present disclosure is not limited to the embodiments. Various modifications to the embodiments and Example that are conceivable by a person of skill in the art and modes obtained by combining part of components in the embodiments and Example are also included in the scope of the present disclosure, so long as they do not depart from the spirit of the present disclosure.

The photoelectric conversion element according to the present disclosure is useful for image sensors etc. used in various imaging devices typified by digital cameras.

What is claimed is:

1. An imaging device comprising:
a plurality of pixels; and
a voltage supply circuit, wherein
each of the plurality of pixels includes:
a pixel electrode;
a counter electrode;
a photoelectric conversion layer that is located between the pixel electrode and the counter electrode and that generates an electron and a hole; and
a charge blocking layer located between the pixel electrode and the photoelectric conversion layer,
the charge blocking layer contains an impurity and has a first surface facing the photoelectric conversion layer and a second surface facing the pixel electrode,
a concentration of the impurity on the first surface is higher than a concentration of the impurity on the second surface, and
the voltage supply circuit supplies a first voltage between the counter electrode and the pixel electrode in a first period and supplies a second voltage different from the first voltage between the counter electrode and the pixel electrode in a second period.

2. The imaging device according to claim 1, wherein a photoelectric conversion efficiency of the plurality of pixels in the first period differs from a photoelectric conversion efficiency of the plurality of pixels in the second period.

3. The imaging device according to claim 1, wherein
the imaging device is operated in a global shutter mode in which each of the plurality of pixels has an exposure period in a same period, and
the exposure period is a period for storing one of the electron and the hole generated in the photoelectric conversion layer.

4. The imaging device according to claim 3, wherein
the first period is the exposure period, and
the second period is a non-exposure period other than the exposure period during an operation of the imaging device.

5. The imaging device according to claim 4, wherein, when the second voltage is supplied between the counter electrode and the pixel electrode, the electron and the hole in the photoelectric conversion layer are recombined.

6. The imaging device according to claim 4, wherein, when the first voltage is supplied between the counter electrode and the pixel electrode, the photoelectric conversion layer exhibits sensitivity to photoelectric conversion.

7. The imaging device according to claim 1, wherein the voltage supply circuit selectively applies, between the counter electrode and the pixel electrode, a voltage that causes a potential of the counter electrode relative to the pixel electrode to be positive or negative.

8. The imaging device according to claim 1, wherein the charge blocking layer includes:
a first layer containing a first material; and
a second layer containing a second material and doped with the impurity,
the first layer is in contact with the pixel electrode, and
the second layer is located between the first layer and the photoelectric conversion layer.

9. The imaging device according to claim 8, wherein the first layer has a smaller thickness than the second layer.

10. The imaging device according to claim 8, wherein the first layer has a larger thickness than the second layer.

11. The imaging device according to claim 8, wherein the second layer is in contact with the photoelectric conversion layer.

12. The imaging device according to claim 8, wherein the charge blocking layer further includes a third layer that is located between the second layer and the photoelectric conversion layer and that contains a third material.

13. The imaging device according to claim 8, wherein the second layer contains a counter anion.

14. The imaging device according to claim 8, wherein the first layer has a thickness larger than or equal to 10 nm.

15. The imaging device according to claim 8, wherein the first layer has a carrier density lower than $1 \times 10^{16}$ cm$^{-3}$.

16. The imaging device according to claim 8, wherein the second layer has a thickness larger than or equal to 10 nm.

17. The imaging device according to claim 8, wherein the second layer has a carrier density higher than or equal to $1 \times 10^{16}$ cm$^{-3}$.

18. The imaging device according to claim 1, wherein
the charge blocking layer is an electron blocking layer,
the photoelectric conversion layer contains an acceptor material, and an energy level of a lowest unoccupied molecular orbital of the charge blocking layer is lower than an energy level of a lowest unoccupied molecular orbital of the acceptor material.

19. The imaging device according to claim 1, wherein the impurity is an acceptor impurity.

20. The imaging device according to claim 1, wherein each of the plurality of pixels further includes an amplifying transistor, and the pixel electrode is connected to the amplifying transistor.

21. A method for driving the plurality of pixels in the imaging device according to claim 1, the method comprising:

applying, between the counter electrode and the pixel electrode, a voltage that causes a potential of the counter electrode relative to the pixel electrode to be positive; and applying, between the counter electrode and the pixel electrode, a voltage that causes a potential of the counter electrode relative to the pixel electrode to be negative.

* * * * *